United States Patent [19]

Groom, III et al.

[11] 3,849,741

[45] Nov. 19, 1974

[54] FAST RISE TIME OSCILLATOR

[75] Inventors: Lemuel D. Groom, III, Dallas, Tex.; Lavell Jordan, Jr., Plano, Colo.

[73] Assignee: Texas Instruments Incorporated, Dallas, Tex.

[22] Filed: Sept. 25, 1970

[21] Appl. No.: 75,422

[52] U.S. Cl. .................................. 331/165, 331/174

[51] Int. Cl. ......................... H03b 5/00, H03b 11/00

[58] Field of Search ........... 331/165, 166, 173, 174, 331/117

[56] References Cited

UNITED STATES PATENTS

| | | | |
|---|---|---|---|
| 3,215,947 | 11/1965 | Loughlin et al. | 331/166 |
| 3,503,008 | 3/1970 | Delignieres | 331/166 |

*Primary Examiner*—John Kominski

*Attorney, Agent, or Firm*—Harold Levine; Rene E. Grossman; Alva H. Bandy

[57] ABSTRACT

A circuit and method of operation thereof are disclosed for initiating oscillations in an oscillator at a signal level greater than the signal level of undesired interference which decreases the rise time of the oscillator. The oscillator circuit includes a transistor which initially has one of its junctions in a forward biased condition, preferably the collector-base junction, and then causing the transistor to operate in a normal transistor mode which reverse biases the collector-base junction and produces an internal transient which occurs in the circuit by the quick turn-off time of the junction. The internal transient injected into the feedback loop of the oscillator causes a rapid build up of oscillations and thus a reduced rise time of oscillation to occur in the oscillator circuit.

10 Claims, 9 Drawing Figures

INVENTORS
Lemuel D. Groom, III
Lavell Jordan, Jr.
BY René E. Grossman
ATTORNEY

FAST RISE TIME OSCILLATOR

This invention relates to oscillating systems, and more particularly to a method and apparatus which produces rapid initiation of the rise time in the output of an oscillator.

Normally, when power is supplied to an oscillator, the initial oscillations build up from circuit noise. In the initial buildup of such oscillations, the oscillator circuit is operating in a high gain configuration in order to attempt to rapidly build up the oscillations to its predetermined level. By injecting a controlled internal transient into the oscillator circuit at the initiation of oscillation, the output builds up from that transient amplitude, not from circuit noise or extraneous external signals. If a transient signal is applied or energy is injected into the oscillator loop, the phase of oscillation may also be controlled. Cost, packaging, and signal application problems, however, may preclude the use of a separate circuit for the generation of a transient and its introduction into the oscillator loop.

It is an object of this invention to avoid the necessity of a separate circuit for generating the controlling transient signal.

It is an object of this invention to generate a controlled transient within the oscillator loop.

It is another object of this invention to reduce the effect of phase interaction between the oscillator signal and external signals.

It is another object of the invention to decrease the rise time of the oscillator output signal.

It is yet another object of the invention to shorten the oscillator pulse rise time by having the first cycle substantially larger than circuit noise or external interference by the insertion of a controlled transient in the oscillator loop.

It is a further object of the invention to utilize a transistor in an oscillator provided with a tuned resonant tank circuit in the dual capacity of first causing a transient to occur in the tuned tank circuit and then maintain or increase the oscillations in the circuit.

It is a still further object of the invention to utilize an oscillator transistor to effect energy storage within a tuned resonant tank circuit and also as a normal transistor in a pulsed oscillator.

Other objects and features of the invention will become more readily understood from the following detailed description when read in conjunction with the appended claims and accompanying drawings in which:

FIG. 2(*b*) is the output of a typical prior art oscillator which is stimulated by an input pulse such as is illustrated in FIG. 2(*a*).

FIG. 2(*c*) is an illustration of the controlled internal transient generated in the loop of the oscillator of FIG. 1;

FIG. 2(*d*) is the output of the oscillator of FIG. 1;

FIG. 4(*b*) is a time expanded waveform of the input pulse applied to the oscillator and is identical to FIG. 2(*a*); and FIG. 4(*c*) is a time expanded waveform of the internal transient produced in the oscillator loop and is identical to FIG. 2(*c*).

Figure 1:
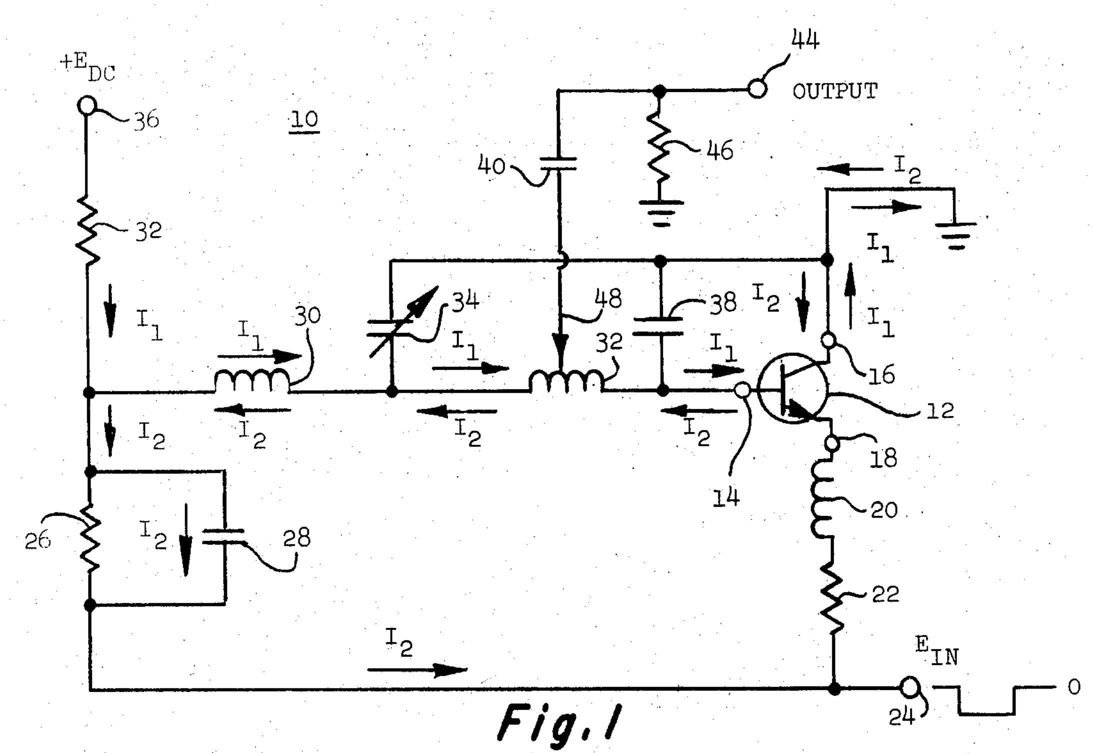
FIG. 1 is a schematic diagram of a circuit according to the present invention.

Referring now to FIG. 1, an oscillator 10 is illustrated according to the present invention. An oscillator NPN-transistor 12 has a base 14, collector 16 and emitter 18. One side of RF choke 20 is connected to emitter 18 while the other side is connected to resistor 22. The other side of resistor 22 is connected to input terminal 24. Input terminal 24 is also connected to one side of resistor 26 and capacitor 28 which are connected in parallel and each of which are connected to one side of RF choke 30 and resistor 33. The other side of resistor 33 is connected to terminal 36 which has applied thereto a positive voltage of $E_{DC}$. The other side of RF choke 30 is connected to inductor 32 and variable capacitor 34. The other side of inductor 32 is connected to one side of capacitor 38 and to base 14 of transistor 12. The collector of transistor 12 is electrically interconnected to ground as well as to the other side of capacitors 34 and 38. RF chokes 20 and 30 provide RF isolation so that the oscillator RF currents do not flow to other interconnected circuit networks. Resistors 22, 26 and 33 are bias resistors. Inductor 32, capacitors 34 and 38, along with oscillator transistor 12 form the resonant tuned tank circuit or oscillator loop of the oscillator. The output from oscillator 10 is taken from terminal 44 across load resistor 46, one side of which is grounded while the other side is connected to one side of capacitor 40. The other side of capacitor 40 is connected to tap 48 from inductor 32.

Figures 2A, 2B, 2C, 2D:
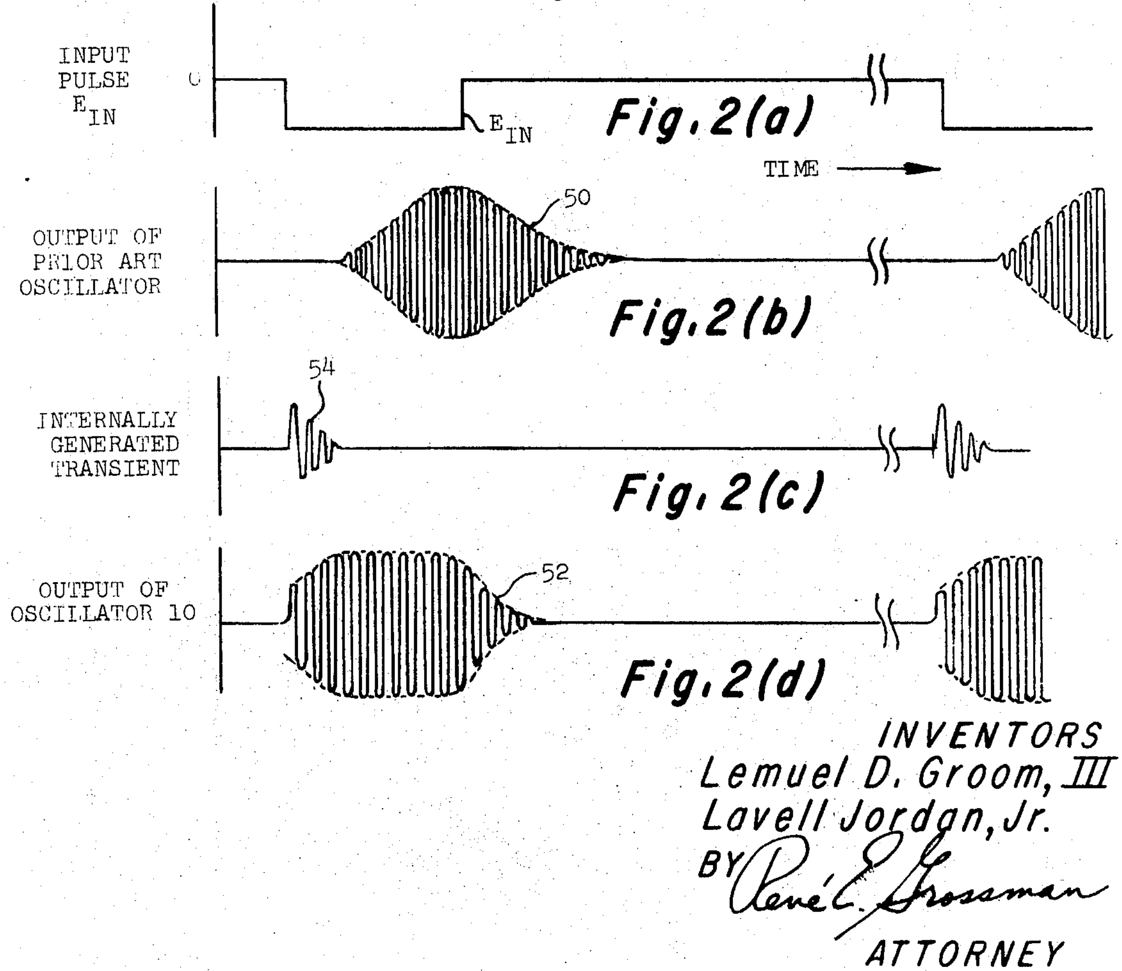
FIG. 2(*a*) is the repetitive input pulse applied to the input of oscillator of FIG. 1.

The operation of the schematic of FIG. 1 will be discussed in conjunction with FIGS. 2–4. FIG. 2(*a*) illustrates the repetitive input pulse $E_{IN}$ which is applied to terminal 24 of oscillator 10. Ordinarily, prior art oscillators begin to build up their oscillations from noise or interference signals and therefore are susceptible to synchronize with any other oscillation of approximately the same frequency that may be present (such as extraneous noise and/or interference signals). These problems are discussed in *Radio Engineering*, Fourth Edition, by Frederick Emmons Terman, McGraw Hill Book Company, Inc., 1955, pages 490 et seq. As discussed therein and illustrated in FIG. 2(*b*), an oscillator which builds up its oscillations from noise or thermal agitation will have a long rise time of the pulse envelope 50. By generating an internal transient in the oscillator loop such as is illustrated in FIG. 2(*c*), at or near the frequency of the resonant tank circuit of the oscillator, the oscillator will begin oscillations substantially above the circuit noise or thermal agitation level (illustrated in FIG. 2(*b*)) and the output will thereby have a much faster pulse envelope rise time 52 as illustrated in FIG. 2(*d*). Furthermore, the initial phase of the output oscillations shown in the wave form from FIG. 2(*d*) and obtained from the oscillator circuit 10 of FIG. 1 will not be phased locked, dependent upon or tend to synchronize with undesired external interference or noise.

Figures 4A, 4B, 4C:
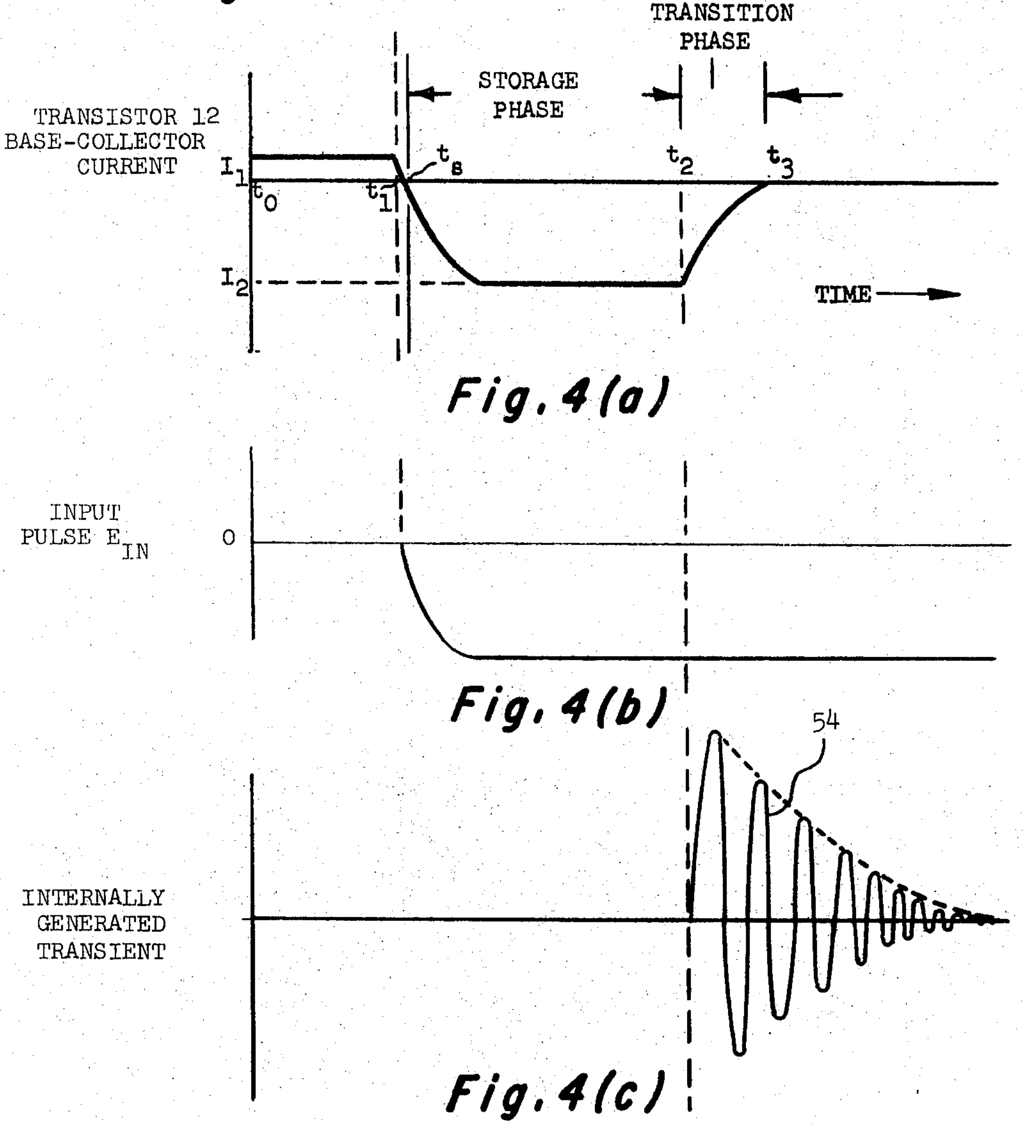
FIG. 4(*a*) illustrates a time expanded waveform of the transistor base-collector current flowing in the oscillator.

Referring again to FIG. 1, prior to the time that the input pulse $E_{IN}$ is applied to terminal 24 and said terminal is at ground potential (i.e., $t_0$ to $t_1$ in FIG. 4(*b*)), the collector-base junction of transistor 12 is forward biased. This is accomplished by voltage source $E_{DC}$ which forward biases the collector-base junction of transistor 12 and causes a current $I_1$ to flow through resistor 33, through RF choke 30 and inductor 32, through the base-collector junction of transistor 12 to ground. The size of the emitter bias resistor 22 restricts the flow of current through emitter 18 and the size of bias resistor 26 restricts the flow of current through the branch of the circuit where the parallel combination of resistor 26 and capacitor 28 is located.

Figure 3:
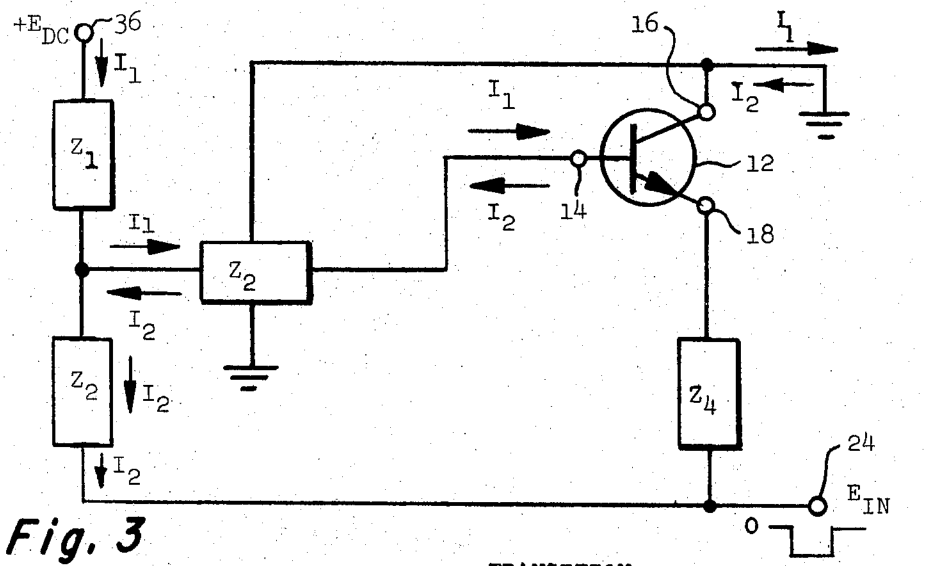
FIG. 3 is a simplified schematic diagram of the circuit of FIG. 1 showing all impedances lumped together for the purpose of simplifying the explanation of the oscillator and in particular, the transistor collector-base current changes.

In order to more fully explain the sequence of current flow prior to and after application of the input pulse $E_{IN}$ to terminal 24 and illustrated in FIG. 2(*a*), there is illustrated in FIG. 3 the transistor 12 with the individual circuit components blocked into impedances $Z_1$, $Z_2$, $Z_3$ and $Z_4$ for illustration purposes. The relationship between the individual circuit components illustrated in FIG. 1 and the impedance figures $Z_1$–$Z_4$ will be straight forward upon inspection. The impedance $Z_4$ connected to the emitter 18 of transistor 12 is comparatively of such a large magnitude that it will draw only negligible current. In FIG. 3, the DC current $I_1$ is defined as that current which flows prior to the application of the input pulse $E_{IN}$. This current $I_1$ which flows prior to the application of $E_{IN}$ (i.e., $t_0$–$t_1$ in FIG. 4(*a*)) is illustrated conventionally as flowing from the positive voltage source $E_{DC}$ through impedances $Z_1$ and $Z_2$ ($Z_3$ drawing negligible current as mentioned previously) and in a forward biased direction through the collector-base junction of transistor 12 to ground. The direction of current flow through the junction of transistor 12 is caused by the base 14 being more positive than the collector 16 of transistor 12 due to the presence of the positive voltage $E_{DC}$ at terminal 36 and the fact that the common junction of resistor 33 and resistor 26 is essentially at ground. The collector-base junction in a forward bias condition presents a relatively low impedance to current flow.

When the input pulse $E_{IN}$ is applied to terminal 24, the base 14 becomes more negative than the collector 16 and the current flowing through the collector-base junction will attempt to switch into a reverse biased condition. In the steady-state reverse bias condition, the collector-base junction of transistor 12 presents a relatively high impedance thereby allowing only negligible current to be conducted therethrough. In reverse biasing the collector-base junction, it has been discovered that there is a finite time during which the collector-base junction of transistor 12 conducts current in the reverse direction after the application of the negative input pulse $E_{IN}$ to terminal 24. This reverse current flow is defined as $I_2$ and is only present during the reverse recovery time of the collector-base junction of transistor 12. The reverse recovery time is divided into two phases as shown in FIG. 4, the storage and the transition phase. Referring to FIG. 4(*a*), the storage phase begins at time $t_s$, when the current through the base-collector is reversed, and continues until time $t_2$, just prior to when the current in the collector-base begins to decrease to zero again. The transition phase is illustrated in FIG. 4(*a*) as occuring between time $t_2$ and time $t_3$.

The reverse recovery time arises from minority carrier storage. Under forward bias conditions, the collector-base junction of transistor 12 (which is a PN junction) injects minority carriers into the region of opposite type conductivity. The storage phase of the reverse recovery time exists from the time the negative input pulse $E_{IN}$ is realized, $t_s$, until time $t_2$, when the minority carriers in the immediate neighborhood of the collector-base junction of transistor 12 are removed. During the storage phase, reverse current $I_2$ flows through the collector-base junction of transistor 12. This current $I_2$, as illustrated in FIGS. 1 and 3, flows through the collector-base junction of transistor 12, through inductances 32 and 30, through capacitor 28 and returns to ground through the input pulse source $E_{IN}$. Capacitor 28 provides a low impedance path for current $I_2$ to bypass resistor 26. In FIG. 3, $I_2$ is illustrated flowing through the collector-base junction of transistor 12, through impedances $Z_2$ and $Z_3$ and to ground through the input pulse source. At this time, there is only negligible current through impedance $Z_1$ because it is of such a large magnitude when compared to the specific branches of impedances $Z_2$ and $Z_3$ through which current $I_2$ flows. The storage phase ends at time $t_2$ (shown in FIG. 4) when the minority carriers in the immediate neighborhood of the collector-base junction are removed. The transition phase begins at time $t_2$ and continues until the time when the PN junction represented by the collector-base junction of transistor 12 has fully recovered, which is illustrated as time $t_3$ in FIG. 4(*a*). During the transition phase, the minority carriers still present some distance from the collector-base junction diffuse to the junction and are swept across.

Accordingly, during the transition phase, i.e., from time $t_2$ to time $t_3$ as indicated in FIG. 4(*a*), $I_2$ rapidly goes to zero. Thus the reverse current through the collector-base junction of transistor 12 is abruptly halted at the end of the transition phase. This rapid change in current, i.e. from a magnitude of $I_2$ to zero in an extremely short time period which occurs through inductances 32 and 30 causes a voltage to be induced in these inductances. This controlled induced voltage 54 which is generated at the inductance 32 (i.e., in the oscillator loop) is illustrated in FIGS. 2(*c*) and 4(*c*). The value of the voltage induced in this inductance 32 ($E_{L_{32}}$) is equal to the value of the inductance ($L_{32}$) times the change in current through that inductance with respect to time (*di/dt*), or mathematically, $E_{L_{32}}$ equals $L_{32}\, di/dt$. As an example of the quantity of voltage that is induced across inductance 32, if this inductance has a value of $1.6 \times 10^{-8}$ henries and if the change in current is 0.32 ampere, during a time period of $0.5 \times 10^{-9}$ seconds, the voltage generated would be $1.6 \times 10^{-8} \times (\mathbf{0.32/0.5 \times 10^{-9}})$ or 10 volts. In other words, the energy stored in inductor 32 in the form of magnetic fields caused by the initial current $I_2$ causes the resonant tank circuit to ring at its resonant frequency. This produces a waveform inside the tank circuit such as is illustrated in FIGS. 2(*c*) and 4(*c*). By virtue of this internally generated controlled transient voltage 54 which is at the frequency of the resonant tuned tank circuit, the oscillator 10 will begin its oscillations at a level related to the amplitude of the first cycle of the internally generated transient (illustrated in FIGS. 2(*c*) and 4(*c*)) which is substantially above the thermal agitation, noise or interference present. This thereby produces a short rise time envelope 52 as illustrated in FIG. 2(*d*). At the end of the transition phase, the tuned resonant circuit or oscillator loop will continue the oscillations during the time that the input pulse $E_{IN}$ is applied to input terminal 24. At the termination of input pulse $E_{IN}$, the oscillations of oscillator 10 will be damped out more rapidly than prior art pulse oscillators, due to terminal 24 returning to ground potential which again forward biases the base-collector junction of transistor 12. The collector-base junction then appears as a low impedance across the oscillator loop which reduces the efficiency of the tank, causing this rapid decay.

The rise time of the leading edge of the output envelope and the fall time of the envelope trailing edge are both shorter by virtue of the present invention than that previously obtainable. These reduced reaction times make it possible to generate much shorter duration output pulses and thus pulses at a higher repetition rate than before with similar circuit complexity. An additional important feature is that the resulting output envelope 52 is more rectangular than in the past and allows less complicated circuitry to be employed in the rest of the total system.

It will be noted that the oscillator according to the present invention combines two methods of producing the transient signal in the tuned resonant tank circuit. The first, which has been described above in detail, is to store energy in an inductor in the oscillator loop of the circuit of FIG. 1 and generate an internal transient. The second method is to apply an external transient to the oscillator loop. The voltage induced due to the rapid change in current in RF choke 30 during the transition phase of the collector-base junction of transistor 12 is an example of the application of an external transient to the tuned resonant circuit made up, for example of capacitors 34 and 38 and inductor 32. Accordingly when the oscillation buildup is initiated by transistor 12, it will result from the cumulative effect of the external transient caused by the rapid change in current of RF choke 30 as well as the internally generated transient in inductor 32.

The transistor 12 may be any transistor (for example, NPN or PNP) which has a transition time less than or equal to one-half the period of the frequency of oscillation and which also has characteristics suitable for use as the oscillator transistor. It will be recognized that the theory of operation of this circuit is equally applicable if the base-emitter junction is switched in lieu of the base-collection junction. A typical set of values for the components of the circuit of FIG. 1 is as follows:

| | |
|---|---|
| $E_{IN}$ | +24–28VDC |
| Resistor 22 | 39 ohms |
| Resistor 26 | 82 ohms |
| Resistor 33 | 1,300 ohms |
| Resistor 46 | 50 ohms |
| RF choke 20 | 0.1μh |
| RF choke 30 | 0.1μh |
| Inductor 32 | .016μh |
| Capacitor 28 | 0.005μfd(5000pf) |
| Capacitor 34 | 15–25 pf adjustable |
| Capacitor 38 | 3.0pf |
| Capacitor 40 | 0.001μfd(1000pfd) |
| Transitor 12 | 2N4874 Mfg. and sold by Texas Instruments Incorporated |

While the principles of this invention have been described in connection with a specific circuit, it is to be understood that this description is made only by way of example and not as a limitation to the scope of the invention. Numerous other circuits using this invention may be devised by those skilled in the art without departing from the spirit and scope of the appended claims.

What is claimed is:

1. A method of rapidly initiating oscillations in an oscillator, including a transistor having a junction, with a tuned circuit electrically connected across said junction, comprising the steps of:

forward biasing said junction, and then reverse biasing said junction to cause a rapid change in current in said junction thereby producing an internal transient in said tuned circuit which produces a rapid build up of oscillation.

2. The method of claim 1 wherein said junction is the base-collector junction of said transistor.

3. The method of claim 1 further including the step of introducing in said tuned circuit an external transient to further enhance build up of oscillations in said oscillator.

4. A method of rapidly initiating oscillations in an oscillator, including a transistor having a junction, with a tuned circuit electrically connected across said junction, comprising the steps of:

forward biasing said junction to store energy within said tuned circuit prior to the initiation of oscillations, and then reverse biasing said junction thereby momentarily providing a reverse current through said junction producing an internal transient in said tuned circuit which produces a rapid build up of oscillation.

5. The method of claim 4 including the step of applying an external transient into the tuned circuit substantially simultaneously with the internal transient.

6. An oscillator for producing an output having first rise time oscillations, comprising:

a. an oscillator transistor having a junction therein, b. a tuned circuit electrically connected across said junction, c. means associated with said transistor for forward biasing said junction to effect energy storage in said tuned circuit prior to the initiation of oscillations, and d. means for reverse biasing said junction to produce a momentary reverse current that causes an internal transient in said tuned circuit immediately prior to the initiation of oscillations.

7. An oscillator according to claim 6 wherein said junction is the base-collector junction of said transistor

8. An oscillator for producing an output having fast rise time oscillations, comprising:

a. an oscillator transistor, b. a tuned circuit electrically connected across the base-collector junction of said transistor, c. network biasing means to effect a forward bias current through said base-collector junction causing energy storage in said tuned circuit, and d. means coupled to said network biasing means for reverse biasing said junction to produce a momentary reverse current that causes an internal transient in said tuned circuit immediately prior to the initiation of oscillations.

9. An oscillator according to claim 8 further including means for applying an external transient essentially simultaneously with the application of said internal transient.

10. An oscillator according to claim 9 wherein said tuned circuit includes at least one inductor in the series path of the base-collector junction and said means for applying includes at least one inductor.

* * * * *